(12) United States Patent
Jeon et al.

(10) Patent No.: US 7,176,085 B2
(45) Date of Patent: Feb. 13, 2007

(54) METHOD OF MANUFACTURING SPLIT GATE TYPE NONVOLATILE MEMORY DEVICE

(75) Inventors: Hee-seog Jeon, Gyeonggi-do (KR); Seung-beom Yoon, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/262,767

(22) Filed: Nov. 1, 2005

(65) Prior Publication Data
US 2006/0063333 A1    Mar. 23, 2006

Related U.S. Application Data

(62) Division of application No. 10/948,155, filed on Sep. 24, 2004, now Pat. No. 7,037,783.

(30) Foreign Application Priority Data
Nov. 4, 2003    (KR)    ............... 2003-77765

(51) Int. Cl.
*H01L 21/336*    (2006.01)
(52) U.S. Cl. ............... 438/257; 438/266; 438/267
(58) Field of Classification Search ............ 438/257, 438/266, 267
See application file for complete search history.

(56) References Cited

U.S. PATENT DOCUMENTS

| 6,486,032 | B1  |   | 11/2002 | Lin et al. |         |
|-----------|-----|---|---------|------------|---------|
| 6,562,673 | B2  | * | 5/2003  | Lin ........................ | 438/211 |
| 6,569,736 | B1  | * | 5/2003  | Hsu et al. ................ | 438/267 |

FOREIGN PATENT DOCUMENTS

| JP | 2001-085544   | 3/2001  |
|----|---------------|---------|
| KR | 1020010091532 | 10/2001 |

* cited by examiner

*Primary Examiner*—Jack Chen
(74) *Attorney, Agent, or Firm*—Volentine & Whitt, PLLC

(57) ABSTRACT

A method of manufacturing a split gate type nonvolatile semiconductor memory device in which control gates are formed by a self aligning process.

7 Claims, 7 Drawing Sheets

METHOD OF MANUFACTURING SPLIT GATE TYPE NONVOLATILE MEMORY DEVICE

CROSS-REFERENCE TO RELATED APPLICATIONS

This is a divisional of application Ser. No. 10/948,155, filed Sep. 24, 2004 now U.S. Pat. No. 7,037,783, the subject matter of which is hereby incorporated by reference in its entirety.

BACKGROUND OF THE INVENTION

1. Field of Invention

Embodiments of the present invention relate to a method of manufacturing a split gate type nonvolatile memory device in which a control gate is formed using a self aligning method.

This application claims the priority of Korean Patent Application No. 03-77765 filed on Nov. 4, 2003 in the Korean Intellectual Property Office, the disclosure of which is incorporated herein in its entirety by reference.

2. Description of the Related Art

Nonvolatile memory devices have become increasingly popular in various fields (e.g. mobile communications and memory card technologies). In nonvolatile memory devices, data can be electrically erased and recorded, while being retained without a power supply. A transistor included in a nonvolatile memory device may be a stacked gate transistor that includes a floating gate, an insulating film, and a control gate (which are sequentially stacked) or a split gate transistor (incorporating a split gate structure).

FIG. 1 is a cross-sectional view of a nonvolatile memory device with a split gate transistor. The split gate type memory device of FIG. 1 includes a source region 15 (formed in a predetermined region on a substrate 10) and a pair of floating gates 20 (formed adjacent to the both ends of the source region 15 on the substrate 10). Upper faces of the floating gates 20 are covered by intergate oxide films 25. Side walls of the floating gates 20 (opposite to the source region 15) are covered by control gates 30. The control gates 30 cover upper faces of the intergate oxide film 25 in one direction and cover a portion of the substrate 10 on an opposite side of the source region 15 of the floating gate 20 in the other direction. Drain regions 35 are formed on the substrate 10 adjacent to the control gate 30. The drain regions 35 partially overlap the control gate 30. A gate insulating film 40 is formed between the floating gate 20 and the substrate 10. The gate insulating film 40 extends underneath the floating gate 20. A tunnel insulating film 45. The tunnel insulating film 45 is under the control gate 30.

In a split gate type memory device, floating gates 20 and control gates 30 have a split configuration. The data can be stored by electron injection (writing) and discharge (erasing) to and from the floating gate 20, by varying currents. In a writing mode, when applying a high voltage (e.g. 15 V) to the source region 15 and applying an appropriate voltage to the drain region 35, hot electrons are injected into the floating gate 20. The hot electrons pass through the gate insulating film 40 from the substrate 10 under the floating gate 20 adjacent to the control gate 30. The gate insulating film 40 may increase electrical potential of the floating gate 20 by coupling the voltage applied to the source region 15. In an erasing mode, a high electric field (on an edge tip of the floating gate 20) is generated when more than 15 V is applied to the control gate 30. Electrons in the floating gate 20 are then discharged to the control gate 30. The intergate oxide film 25 maintains a large electric potential difference between the control gate 30 and the floating gate 20 by reducing the coupling ratio between the two gates 20 and 30. The electron injection into the floating gate 20 is accomplished by a Channel Hot Electron Injection (CHEI) method. The electron discharge is accomplished by a Fowler-Nordheim (F-N) tunneling through the tunnel insulating film 45 interposed between the floating gate 20 and the control gate 30.

The split gate type memory device of FIG. 1 may be manufactured as follows. First, a gate insulating film 40 is formed on the entire surface of a semiconductor substrate 10. Next, a first polysilicon film (for forming a floating gate 20 with a predetermined thickness) is formed on the gate insulating film 40. After patterning the first polysilicon film (by using a photolithography process), the first polysilicon film is thermally oxidized, forming the floating gate 20 and the intergate oxide film 25 covering the floating gate 20. An insulating film is formed by CVD on the entire surface of the substrate 10 on which the intergate oxide film 25 is formed. A tunneling insulating film 45 is then formed by patterning the insulating film by using a photolithography process, as depicted in FIG. 1. A control gate 30 is formed of polysilicon by patterning (using a photolithography process) a second polysilicon film. The second polysilicon film is formed by conformally depositing polysilicon on a substrate 10 on which the tunneling insulating film 45 is formed.

In a method of manufacturing a split gate type memory device, a photolithography process is utilized for forming a control gate 30. However, there is high probability of photo misalignment in the photolithography process that can cause variation in channel length overlapping. If there is any misalignment, an effective channel length of the control gate varies from one cell to another, resulting in characteristic differences between the two cells which are in a mirror image. For example, an Odd cell (effective length: L1) and an Even cell (effective length: L2) may not be equal. The variation in effective channel length of the control gate 30 causes the variation in threshold voltages of the cells. The variation of threshold voltages of the odd cell and the even cell causes a difference in on-current characteristics of the cells that reduce uniformity of the cells.

SUMMARY OF THE INVENTION

Embodiments of the present invention relate to a method of manufacturing a split gate type memory device having uniform effective channel length in cells. According to aspects of embodiments of the present invention, a method of manufacturing a split gate type semiconductor memory device comprises the following: Forming a gate insulating film and a conductive layer on a semiconductor substrate. Forming mask patterns on the conductive layer to define at least a pair of first openings to expose the conductive layer. Forming an intergate oxide film by a selective thermal oxidation of the conductive layer exposed by the mask patterns. Defining a second opening by removing a portion of the mask patterns between the intergate oxide film. Forming spacers on inner walls of the second opening. Defining a third opening by etching the conductive layer until the gate insulating film is exposed by using the mask patterns, the spacer, and the intergate oxide film as etch masks. Forming a source region by ionic implanting a dopant into the third opening. Forming an insulating film plug by filling the third opening to avoid step with the mask pattern. Exposing side faces of the insulating film plug by removing the mask patterns and the spacer. Forming a pair of floating gates by dry etching the portions of exposed surface of the conductive layer until the surface of the gate insulating film is exposed using the intergate oxide film as an etch mask. Forming tunnel insulating films on the side walls of the floating gates. Forming spacer type control gate by a self aligning method on the walls of the insulating film plug. Forming drain regions at an outer region of the control gate.

According to aspects of embodiments of the present invention, a method of manufacturing a split gate type memory device, comprises the following: Forming a conductive layer on a semiconductor substrate. Forming mask patterns on the conductive layer to define at least a pair of first openings to expose the conductive layer. Forming an intergate oxide film by a selective thermal oxidation of the conductive layer exposed by the mask patterns. Forming a conformal capping oxide film on the mask patterns and the intergate oxide film. Exposing a portion of mask patterns by removing a portion of the capping oxide film between the intergate oxide film. Defining a second opening by removing the exposed mask pattern using the remained capping oxide film as an etch mask. Removing the remaining capping oxide film. Defining a third opening by etching the conductive layer using the remaining mask patterns and the intergate oxide film as etch masks. Forming an insulating film plug, by filling the third opening, to avoid a step with the mask pattern. Exposing side faces of the insulating film plug by removing the mask patterns and the spacer. Forming a pair of floating gates by etching the conductive layer using the intergate oxide film as an etch mask. Forming a tunnel insulating film on the side walls of the floating gates. Forming spacer type control gates by a self aligning method on the walls of the insulating film plug.

BRIEF DESCRIPTION OF THE DRAWINGS

Example

Example

DETAILED DESCRIPTION OF THE INVENTION

Figure 1:
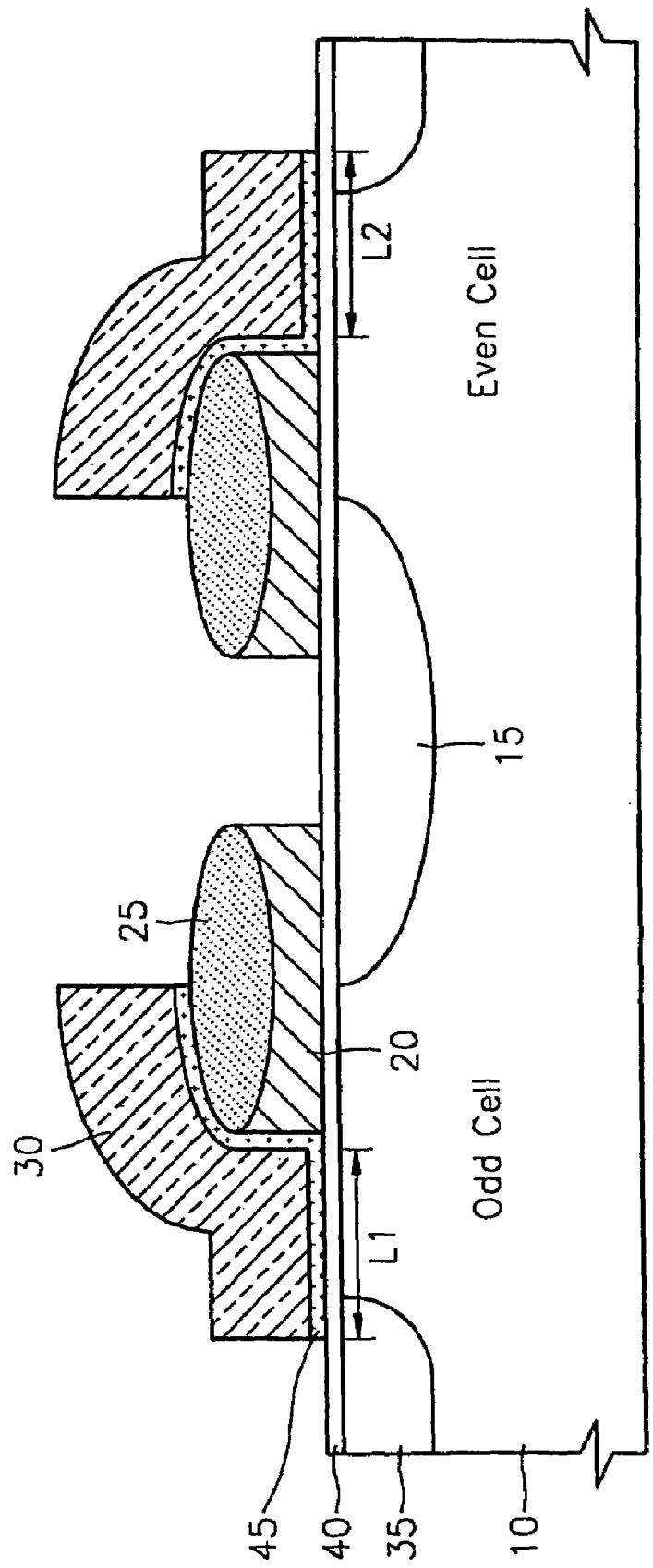
FIG. 1 is a cross-sectional view of a split gate type nonvolatile semiconductor memory device.

Hereinafter, the present invention will be described more fully with reference to the accompanying drawings in which example embodiments of the invention are shown. This invention may, however be embodied in many different forms and should not be construed as being limited to the embodiments set forth herein. Rather, these embodiments are provided so that this disclosure is thorough and complete, and fully conveys the concept of the invention to those skilled in the art. In the drawings, the thickness of layers and regions may be exaggerated for clarity.

Figure 2:
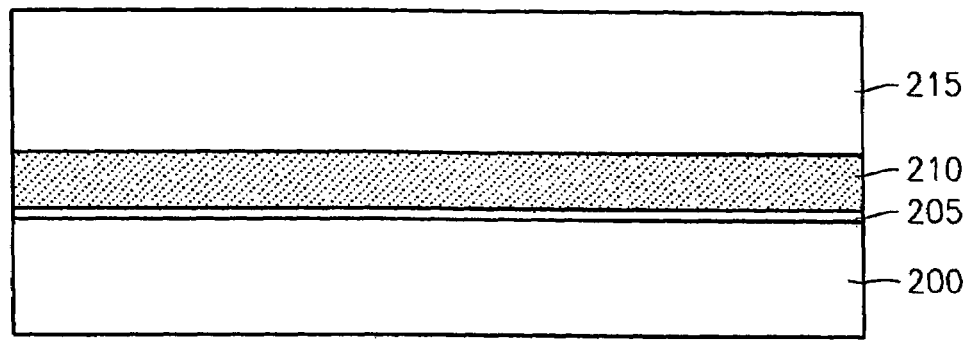
FIGS. 2 through 14 are cross-sectional views of a split gate type nonvolatile semiconductor memory device.

Example FIGS. 2 through 14 are cross-sectional views illustrating a method of manufacturing a split gate type nonvolatile semiconductor memory device, according to embodiments of the present invention. A shallow trench isolation (STI) process (not shown) for isolation of devices is performed on a semiconductor substrate 200 (e.g. a p-type silicon substrate). Referring to example FIG. 2, a gate insulating film 205 is then formed on the substrate 200. For example, a thermal oxide film may be grown to a thickness in a range of 50~150 Å (e.g. 80 Å). A conductive layer 210 (for forming a floating gate) is formed on the gate insulating film 205. For example, a ploysilicon film having a thickness in a range of 500~2,000 Å may be formed by depositing doped polysilicon. The polysilicon film may be formed by an in-situ doping process at the same time as a deposition (e.g. $POCl_3$ deposition) process. Alternatively, the doping by implanting a dopant may be performed after depositing an undoped polysilicon. The dopant implanting process may be performed by implanting n-type dopant (e.g. phosphate (P) of $2.7\times10^{14}$ ions/cm$^2$ with energy of 30 KeV). A mask film 215 (e.g. having a thickness in the range of 2,000~5,000 Å) is formed on the conductive layer 210. The mask film 215 may be formed of a silicon nitride film and can be formed by a reaction between $SiH_4$ and $NH_3$ at the temperature range of 500~850° C. by using a LPCVD (low pressure CVD) method.

Figure 3:
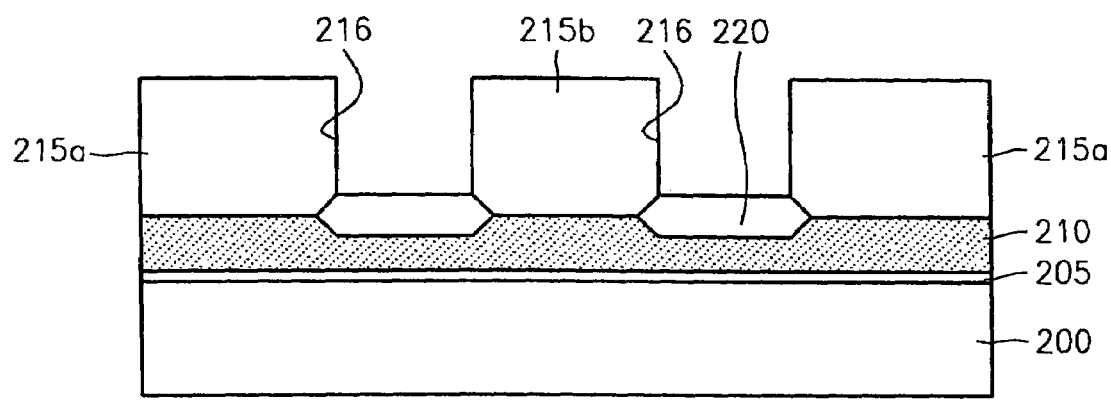

Referring to example FIG. 3, mask patterns 215a and 215b (for defining a pair of openings 216) are formed by patterning the mask film 215 until exposing regions (for forming cells) of the conductive layer, using a predetermined masking process. For etching the mask film 215 formed of silicon nitride, carbon fluoride series gas can be used. For example, the etching gas can be a gas selected from the group consisting of $C_xF_y$ series, or $C_aH_bF_c$ series gas (e.g. $CF_4$, $CHF_3$, $C_2F_6$, $C_4F_8$, $CH_2F_2$, $CH_3F$, $CH_4$, $C_2H_2$, and $C_4F_6$, Argon can be used as an atmospheric gas. The mask patterns 215a and 215b will be used for masking layers for selective oxidation of the conductive layer 210.

The conductive layer 210 in the first opening (i.e. the opened region by the mask patterns 215a and 215b) is thermally oxidized, thereby selectively growing intergate oxide films 220. The intergate oxide films 220 may have a thickness approximately in the range of 500~2,000 Å (e.g. 1,200 Å) by controlling growing time.

Figure 4:
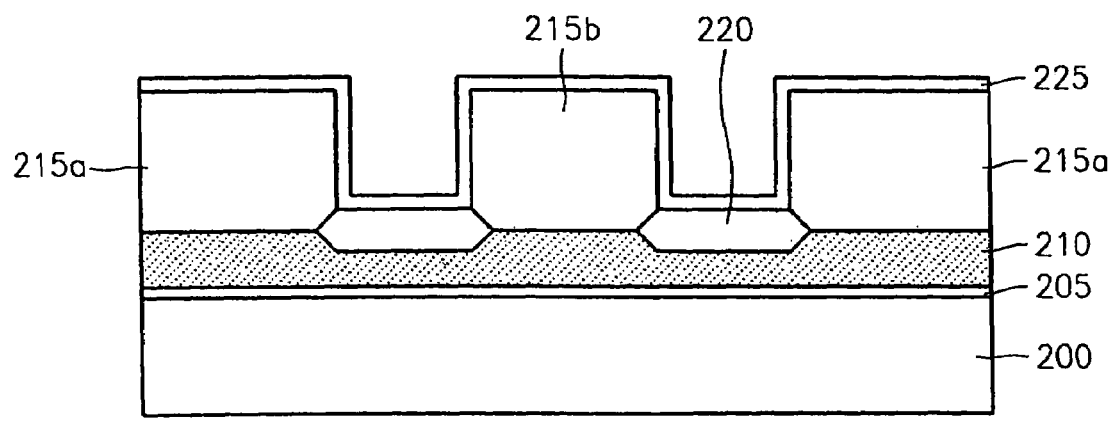

Referring to example FIG. 4, a thin capping film 225 (having a thickness of approximately 100~500 Å) is formed covering the intergate oxide films 220 and the mask patterns 215a and 215b by a deposition method (e.g. a CVD method, SACVD (sub atmospheric CVD) method, LPCVD method, or PECVD (plasma enhanced CVD) method). When using a CVD method, a MTO (middle temperature oxide) can be formed by using a CVD reaction gas (e.g. $SiH_4$, $Si_2H_6$, and $N_2O$). A thin capping oxide film 225 is conformally deposited on the mask patterns 215a and 215b and the intergate oxide films 220. The capping oxide film 225 plays an etch mask for protecting the remaining mask patterns 215a when the mask pattern 215b between the intergate oxide film 220 is removed. Accordingly, in embodiments, the process for forming the capping oxide film 225 can be omitted if other means are used for removing the mask pattern 215b selectively.

Figure 5:
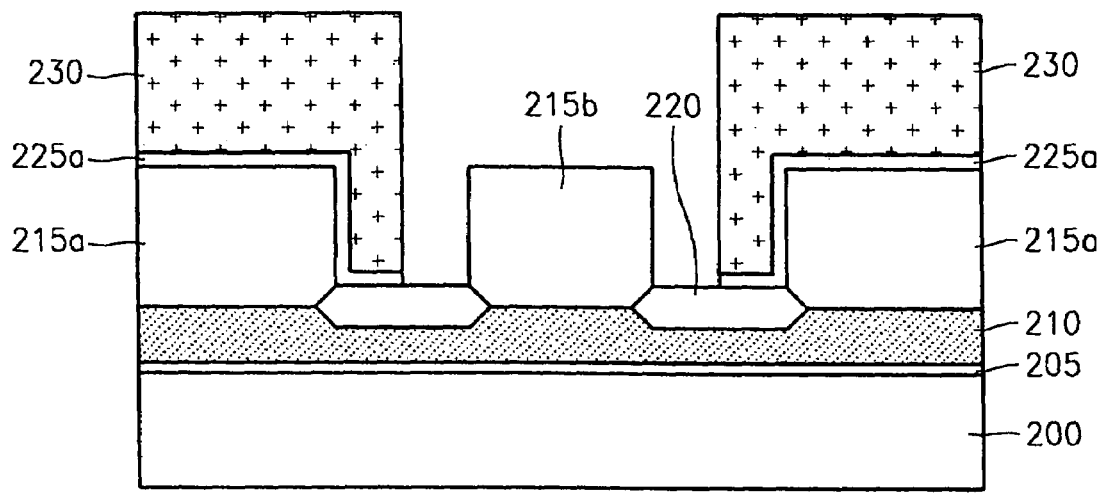

Referring to example FIG. 5, a photoresist pattern 230 (for opening a cell source region; e.g. a region between the intergate oxide films 220) is formed by a masking process. The capping oxide film 225 (in the region for forming the cell source region) is partially wet etched by using the photoresist pattern 230 as an etch mask. The etching solution can be a diluted fluoride acid solution (HF: $H_2O$=1: 5~10, 000) or a BOE (buffered oxide etchant). The capping oxide film 225a exposes the mask pattern 215b region (for forming the cell source region) and covers other regions (including the mask pattern 215a).

Figure 6:
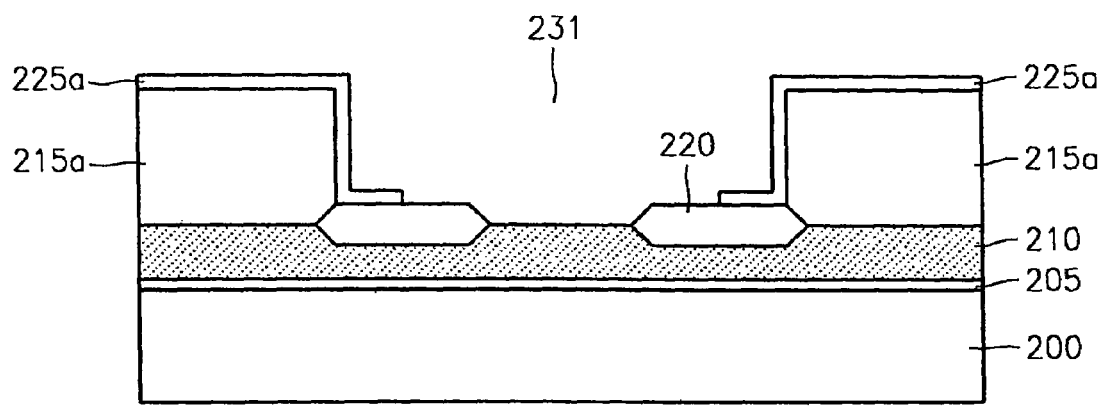
Figure 7:
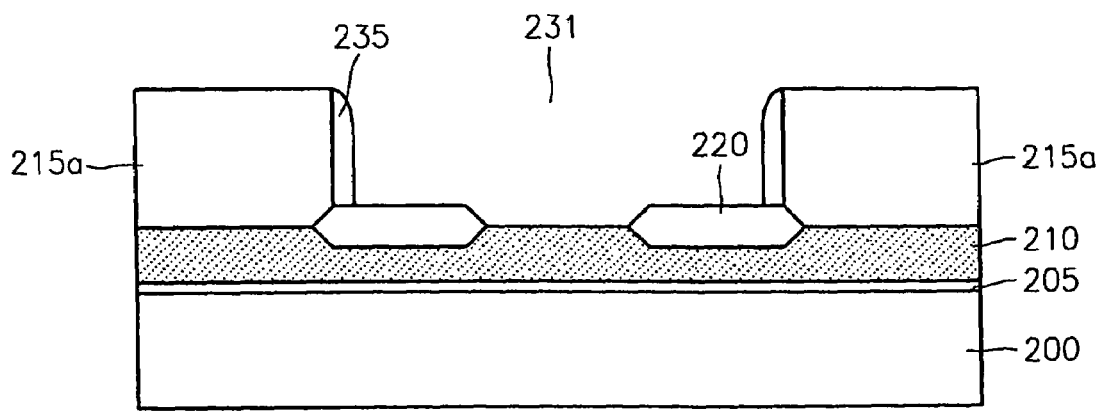

Referring to example FIG. 6, the photoresist pattern 230 is removed by stripping and ashing. The nitride film stripping may be performed by using a phosphoric acid treatment, using the capping oxide film 225a as an etch mask that exposes the mask pattern 215b between the intergate oxide film 220 and covers the mask pattern 215a. A second opening 231 (for a cell source region) is defined by selectively removing the mask pattern 215b.

The capping oxide film 225A is removed by wet etching. An insulating film (e.g. a silicon nitride film with a thickness in a range of 300~1,500 Å) is formed on the mask pattern 215a. As depicted in example FIG. 7, spacers 235 are formed on the walls of the second opening 231 (e.g. on the side walls of the mask patterns 215a) by dry etching the insulating film. The dry etching may use a RIE (reactive ion etching) process until the insulating film is completely removed from upper surfaces of the mask patterns 215a. The spacers 235 are formed for extending an overlapping length between a subsequently formed floating gate and a control gate. The process for forming the spacer 235 may be omitted, if other means are used for securing the overlapping length between the floating gate and the control gate. The spacers 235 may be formed of the same material as the mask pattern 215a (for easy removal).

Figure 8:
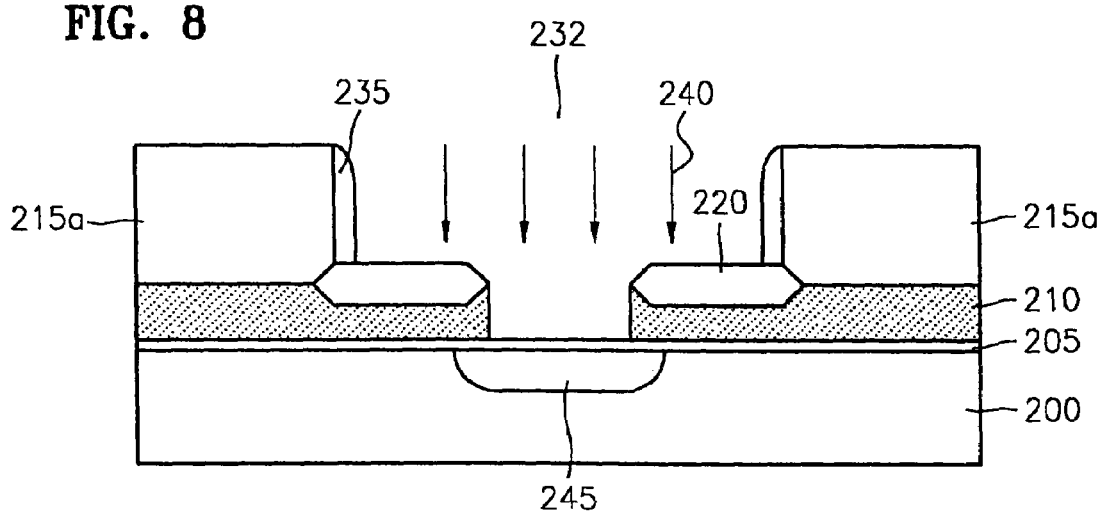

Referring to example FIG. 8, the conductive layer 210 is etched until the gate insulating film 205 is exposed by using the mask pattern 215a, spacers 235, and the intergate oxide film 220 as etch masks. A third opening 232 is defined. A cell source region 245 is formed by implanting an n-type dopant (e.g. a dose range of $1.0E15~1.0E16$ ions/cm$^2$ using an ion implantation method) into the third opening 232. Thermal treatment may be performed for 30 minutes at a temperature approximately 900° C. for driving-in the dopant. Alternatively, if necessary, the cell source region 245 may be formed by sealing the exposed (by etching) side walls of the conductive layer 210 with an oxide film (not shown) under an atmosphere for growing a thermal oxide film. If the side walls of the conductive layer 210 are sealed with an oxide film, etching damage to the conductive layer 210 can be avoided. Also, the cell source region can be formed as a deep junction which enables the cell source region to withstand high voltage applied during data programming.

Figure 9:
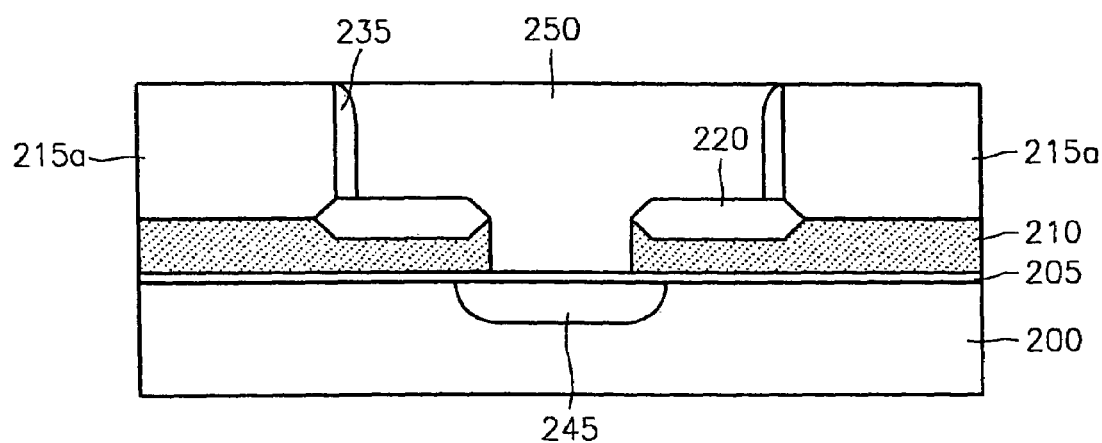

Referring to example FIG. 9, a gap filling oxide film (e.g. having a thickness in a range of approximately 5,000~10,000 Å) is deposited filling the third opening 232 completely, by using a CVD method on the structure of example FIG. 8. The gap filling oxide is planarized by a chemical mechanical polishing (CMP) method until surfaces of the mask patterns 215a are exposed. Then, an insulating film plug 250 (without a step with the mask patterns 215a) is formed in the third opening 232.

Figure 10:
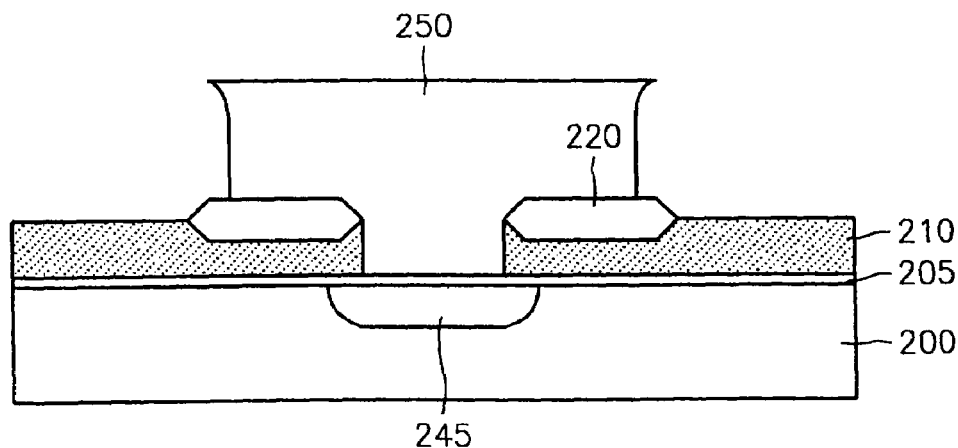

Referring to example FIG. 10, side faces of the insulating film plug 250 are exposed by removing the mask patterns 215a and the spacers 235. When both the mask patterns 215a and the spacers 235 are formed of a silicon nitride film, they can be easily removed at the same time by stripping using phosphoric acid. The insulating film plug 250 (having exposed side faces) can be used for forming control gates by self aligning method in the following process.

Figure 11:
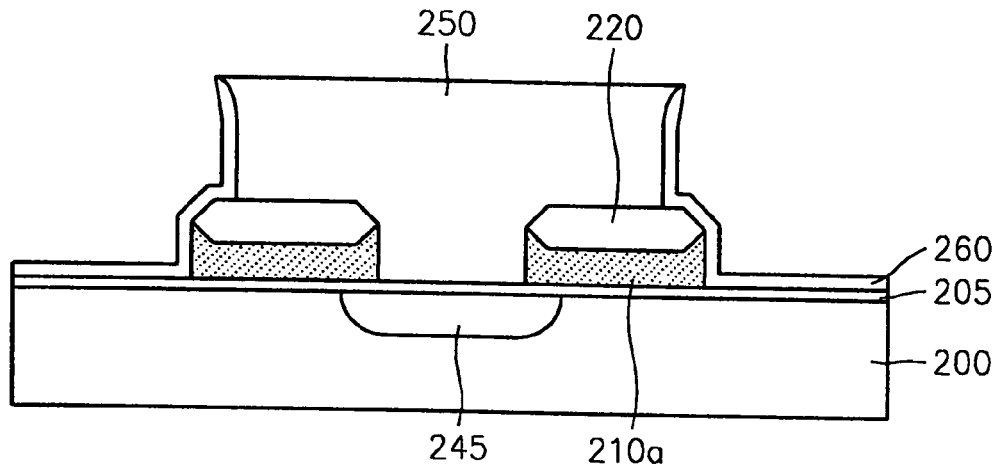

Referring to example FIG. 11, a pair of isolated floating gates 210a are formed by dry etching portions of the exposed surface of the conductive layer 210 until the surface of the gate insulating film 205 is exposed, using the intergate oxide film 220 as an etch mask. A mixed gas of HBr, HeO$_2$, N$_2$ and CF$_4$ may be used as an etchant gas for the conductive layer 210 formed of doped polysilicon. The straightness of the etchant gas can be significantly improved by applying bias toward the substrate 200. Tunnel insulating films 260 are formed by growing a thermal oxide film (e.g. having a thickness in a range of 50~150 Å) and consecutively depositing another oxide film (e.g. a high temperature CVD oxide film having a thickness in a range of 50~150 Å) on the thermal oxide film. The CVD oxide film may be hardened by heat treating for 30 minutes at a temperature of approximately 1,000° C. The CVD oxide film (which may have a large step coverage characteristic) is deposited on the insulating film plug 250. The deposition on the insulating film plug 250 is not shown in example FIG. 11 because the CVD oxide has similar components to the insulating film plug 250.

Figure 12:
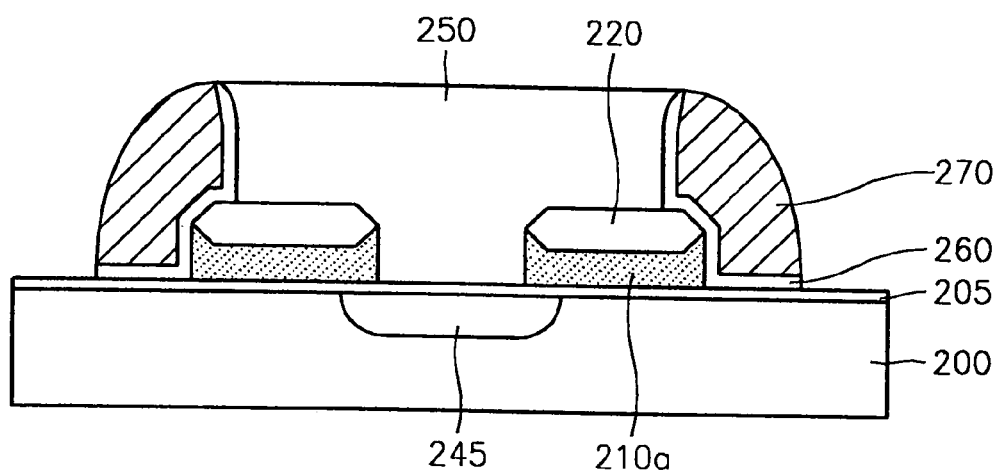

Referring to example FIG. 12, a second conductive layer (e.g. a polysilicon film having a thickness in a range of 2,000~5,000 Å) is formed on the tunnel insulating film 260. Spacer type control gates 270 are formed by dry etching the second conductive layer using a RIE method on the side walls of the insulating film plug 250. Accordingly, the control gates 270 are formed to a uniform length by self aligning on the walls of the insulating film plug 250, without using a photolithography process. A silicide reaction may also be performed on the control gate 270, which is formed of polysilicon. Types of silicide that may be used for the silicide reaction are tungsten silicide, cobalt silicide, and titanium silicide. Tungsten silicide and titanium silicide can be formed by RTA (rapid thermal annealing) reaction after depositing cobalt or titanium on the polysilicon. When forming a cobalt layer, the RTA (for reaction between the polysilicon and the cobalt) may be conducted under a nitrogen gas atmosphere for approximately 50 seconds at the temperature range of 400~500° C. This process produces a layer having a CoSi phase. The resultant product may be annealed again using the RTA method under a nitrogen atmosphere for 30 seconds at the temperature range of 800~900° C. to a further low resistance phase (like the CoSi$_2$ phase). When forming a nickel layer, a NiSi phase can be obtained by a one step heat treatment at a low temperature. A tungsten silicide can be directly deposited using a CVD process.

Figure 13:
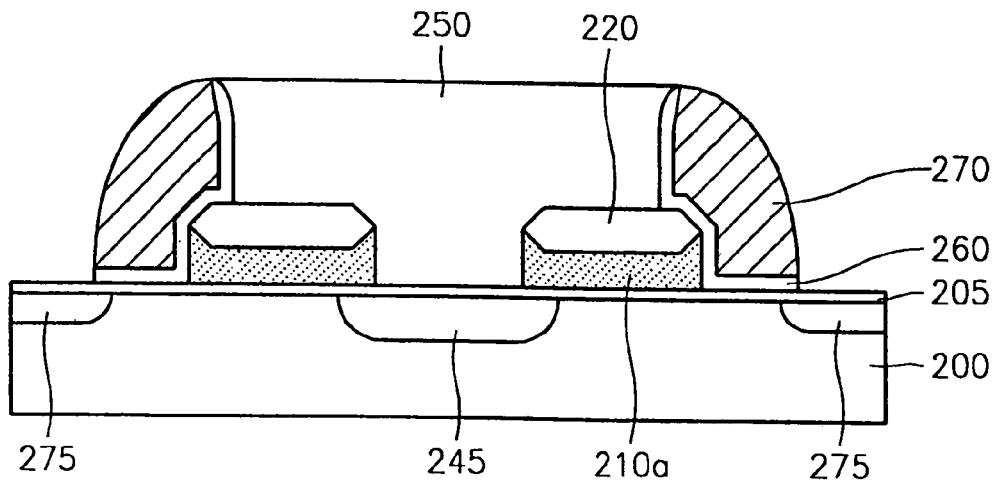

As depicted in example FIG. 13, drain regions 275 are formed on outer side of the control gates 270 by ionic implanting an n-type dopant (e.g. a dose range of $1.0E15~1.0E16$ ions/cm$^2$) using a mask and a heat treatment.

Figure 14:
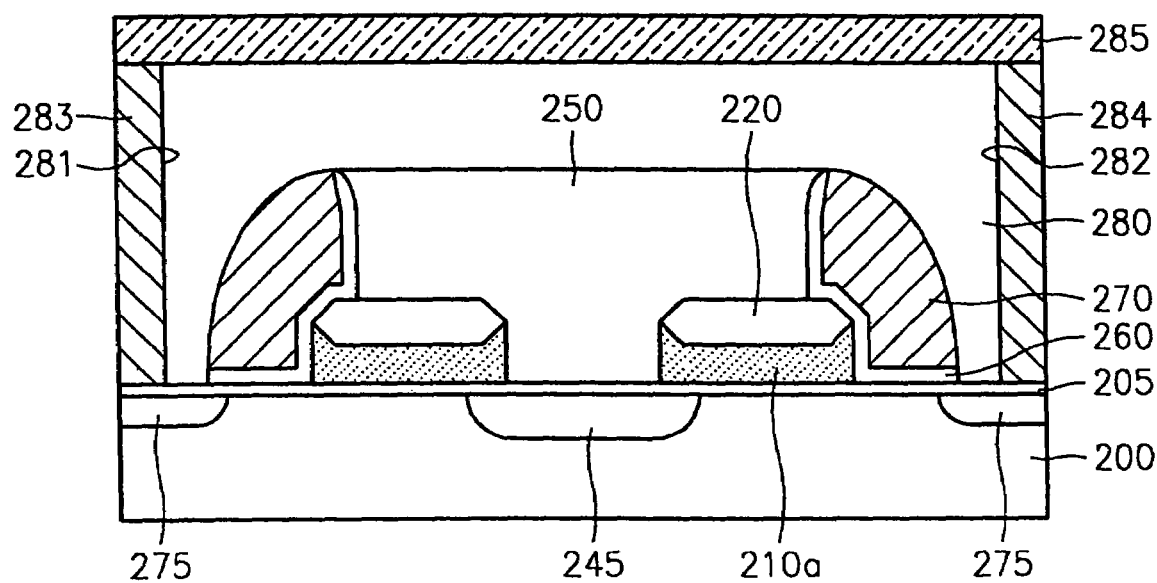

Referring to example FIG. 14, a formation of a conductive metal plug 283 and 284 (e.g. tungsten plugs) comprises: Thickly depositing and planarizing an interlayer insulating film 280 on the structure of example FIG. 13. Forming contact holes 281 and 282 (for exposing the drain regions 275) by a photolithography process. Thickly depositing a conductive metal layer filling the contact holes 281 and 282. Polishing the conductive metal layer using a CMP process, to selectively remove the conductive metal layer from a surface of the interlayer insulating film 280.

A metal layer for forming a metal wiring pattern 285 is deposited on the interlayer insulating film 280 and the metal plugs 283 and 284. The metal layer is etched by a photolithography process to form the metal wiring pattern 285, which is connected to each metal plug 283 and 284, completing a split gate type nonvolatile semiconductor memory device. The metal wiring pattern 285 is used as a bit line for data transferring when programming and reading.

Figure 15:
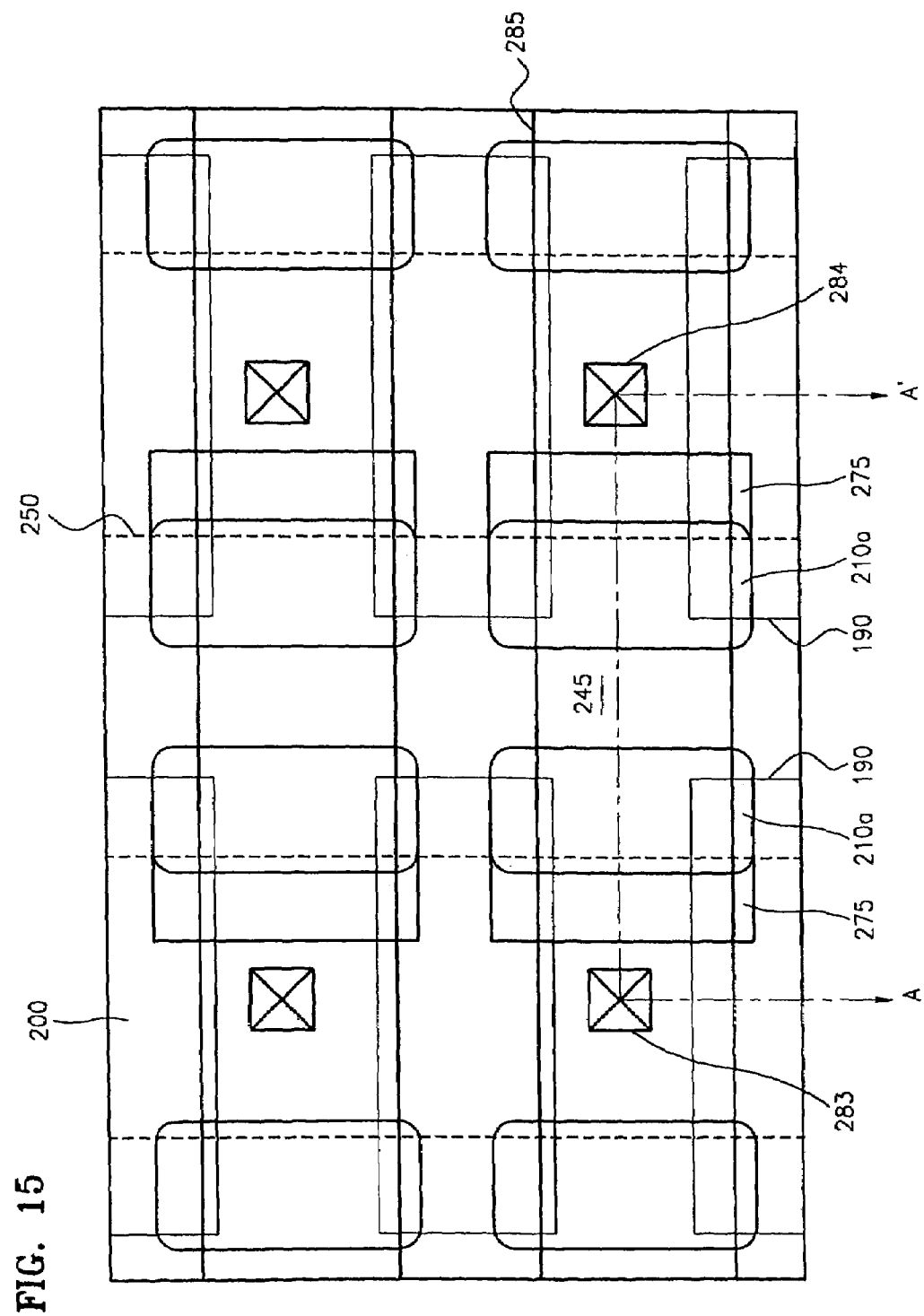
FIG. 15 is a layout of a split gate type nonvolatile semiconductor memory device.

Example FIG. 15 is a lay-out of a split gate type non-volatile semiconductor memory device, according to embodiments of the present invention. In FIG. 15, reference numeral "190" refers to a device isolation film (e.g. an STI). In the drawing, floating gates 210a, control gates 270 (of FIG. 14), cell source regions 245, and drain regions 275 are illustrated as solid lines, are disposed. Insulating film plugs 250 are illustrated as dotted lines and are disposed between the floating gates 210a. Example FIG. 14 is a cross-sectional view cut along the line A–A' in FIG. 15.

In a method of manufacturing a split gate type memory device according to embodiments of the present invention, a control gate (e.g. a spacer type) is formed by a self aligning process on the side walls of an insulating film plug. Accordingly, in embodiments, the problem of variation in effective channel length can be improved, because there is no misaligning problem caused in a photolithography process for forming the control gate. The use of embodiments of the present invention (for forming a flash memory device) can reduce differences in on-current characteristic by reducing the variation of threshold voltage of odd cells and even cells, enabling uniform cell characteristics.

While this invention has been particularly shown and described with reference to example embodiments, it will be understood by those skilled in the art that various changes in form and details may be made therein without departing from the sprit and scope of the invention as defined by the appended claims.

What is claimed is:

1. A method of manufacturing a split gate type memory device, comprising:

forming a first conductive layer on a semiconductor substrate;

forming mask patterns on the first conductive layer to define at least a pair of first openings to expose the first conductive layer;

forming intergate oxide films by selective thermal oxidation of the first conductive layer exposed by the mask patterns;

forming a conformal capping oxide film on the mask patterns and the intergate oxide films;

exposing a portion of the mask patterns by removing a portion of the capping oxide film between the intergate oxide films;

defining a second opening by removing the exposed mask patterns using the remaining capping oxide film as an etch mask;

removing the remaining capping oxide film;

defining a third opening by etching the first conductive layer using the remaining mask patterns and the intergate oxide films as etching masks;

forming an insulating film plug by filling the third opening to avoid a step with the mask patterns;

exposing side faces of the insulating film plug by removing the mask patterns;

forming a pair of floating gates by dry etching portions of the first conductive layer using the intergate oxide films as etch masks;

forming a tunnel insulating film on side walls of each floating gate; and, forming spacer type control gates by self aligning on side walls of the insulating film plug.

2. The method of claim 1, wherein the mask patterns are formed of silicon nitride and the mask patterns are removed using a phosphate acid strip.

3. The method of claim 1, wherein the formation of the insulating film plug comprises:

forming a gap fill oxide film to completely fill the third opening; and, planarizing the gap fill oxide film until surfaces of the mask patterns are exposed by using a chemical mechanical polishing process.

4. The method of claim 1, wherein the formation of the tunnel insulating film comprises:

oxidizing a resultant product having the floating gates thermally;

depositing oxide films on the floating gates; and, performing a heat treatment to harden the oxide films.

5. The method of claim 1, wherein self aligning on the side wall of the insulating film plug comprises:

depositing a second conductive layer over each floating gate; and, dry etching the second conductive layer to form control gates, each control gate being formed over only a portion of one floating gate.

6. The method of claim 1, wherein the second conductive layer and the control gate are formed of doped polysilicon.

7. The method of claim 1, wherein the mask patterns are formed of a silicon nitride film.

* * * * *